(12) United States Patent
Doche (10) Patent No.: US 6,431,806 B1
(45) Date of Patent: Aug. 13, 2002

(54) ADAPTER DEVICE FOR CARRIER PODS CONTAINING AT LEAST ONE FLAT OBJECT IN AN ULTRACLEAN ATMOSPHERE

(75) Inventor: Claude Doche, Claix (FR)

(73) Assignee: Incam Solutions, Grenoble (FR)

( * ) Notice: Subject to any disclaimer, the term of this patent is extended or adjusted under 35 U.S.C. 154(b) by 0 days.

(21) Appl. No.: 09/320,844

(22) Filed: May 26, 1999

(30) Foreign Application Priority Data

Jun. 8, 1998 (FR) .............................................. 98 07317

(51) Int. Cl.[7] .............................................. B65G 49/07
(52) U.S. Cl. ..................... 414/217; 414/217.1; 414/411; 414/416.03; 414/940; 206/710
(58) Field of Search .............................. 414/217.1, 292, 414/411, 940, 416.03, 416.08, 937, 217, 939; 206/710

(56) References Cited

U.S. PATENT DOCUMENTS

| | | | | |
|---|---|---|---|---|
| 4,739,882 A | * | 4/1988 | Parikh et al. ............ | 414/940 X |
| 4,776,462 A | * | 10/1988 | Kosugi et al. .......... | 206/710 X |
| 5,246,218 A | * | 9/1993 | Yap et al. ................ | 414/940 X |
| 5,372,471 A | * | 12/1994 | Wu .......................... | 414/940 X |
| 5,377,476 A | * | 1/1995 | Bohmer et al. ...... | 414/217.1 X |
| 5,388,945 A | * | 2/1995 | Garric et al. .......... | 414/416.03 |
| 5,509,772 A | * | 4/1996 | Doche ..................... | 414/411 X |
| 5,549,205 A | * | 8/1996 | Doche ........................ | 206/710 |
| 5,664,925 A | | 9/1997 | Muka et al. ................. | 414/217 |
| 5,772,386 A | * | 6/1998 | Mages et al. ........... | 414/940 X |
| 6,068,668 A | * | 5/2000 | Mastroianni ............ | 414/940 X |
| 6,158,946 A | * | 12/2000 | Miyashita .............. | 414/416.08 |
| 6,176,023 B1 | * | 1/2001 | Doche .......................... | 34/451 |
| 6,273,664 B1 | * | 8/2001 | Doche ......................... | 414/217 |

FOREIGN PATENT DOCUMENTS

| | | |
|---|---|---|
| EP | 0 735 573 A1 | 10/1996 |
| FR | 2 697 000 A1 | 4/1994 |
| FR | 2 747 111 A1 | 10/1997 |
| FR | 2 747 112 A1 | 10/1997 |
| JP | 1044035 * | 2/1989 ................. 414/940 |
| JP | 5246508 * | 9/1993 ................. 414/940 |

\* cited by examiner

*Primary Examiner*—James W. Keenan
(74) *Attorney, Agent, or Firm*—Oliff & Berridge PLC (57) ABSTRACT

An adapter device is placed on a movable plate of a base of an interface device to position a carrier pod at a preset height enabling a standard interfacing system with equipment machines to be used. A side wall of the adapter device comprises a guiding aperture enabling the carrier pod to pass to bring the first door and its lock into alignment with a front support plane of the side wall. A controller is provided to couple the first door with a second door and to unlock the first door when the side wall accosts against a front face of the interface device.

12 Claims, 14 Drawing Sheets

ADAPTER DEVICE FOR CARRIER PODS CONTAINING AT LEAST ONE FLAT OBJECT IN AN ULTRACLEAN ATMOSPHERE

BACKGROUND OF THE INVENTION

The invention relates to an adapter device for containers, hereinafter called carrier pods, containing at least one flat object in an ultraclean atmosphere, each carrier pod comprising an elongate body able to be sealed by means of a first door associated to a first lock, and designed to be placed facing a second door of an interface device to perform transfer of the flat object to the production equipment.

STATE OF THE PRIOR ART

Collective containers or carrier pods exist housing a series of silicon wafers, each wafer having for example a diameter of 300 mm. These containers are opened at the level of the production equipment by means of an interface device enabling access to the wafers. An interface device of this kind is described in detail in the document EP-A-0 735 573.

The collective silicon wafer handling technology has given rise to interfacing standards of the machines commonly used for production. This system for transport of the silicon wafer and transfer with the production machines nevertheless proves unsuitable for management of test wafers, which are used singly, or in small numbers, and serve the purpose of adjusting the machine settings.

Incorporating a single silicon wafer in a collective pod able to contain up to twenty-five wafers would have significant incidences on the economy of the production system, on account of the fact that individual handling of test wafers represents a large fraction of about 15% to 20% of a production unit turnover.

To overcome this drawback, individual containers would simply have to be used, for example described in the document FR-A-96 04173, or containers containing several wafers, to handle and stock test wafers. The use of different containers does however give rise to the problem of compatibility with the standardized interfacing device.

OBJECT OF THE INVENTION

The object of the invention is to achieve an adapter device enabling the equipment interfacing means for the opening and closing cycle of collective carrier pods to be used for opening and closing of individual carrier pods.

According to the invention, the adapter device is placed on a movable support plate of the base of the interface device to position the carrier pod at a preset height enabling the standard interfacing system with the equipment machines to be used. A side wall of said adapter device comprises a guiding aperture allowing the carrier pod to pass to bring the first door and its lock into alignment with the front support plane of the side wall. Control means are provided to couple the first door with the second door and to unlock the first door when the side wall accosts against the front face of the interface device.

According to a first mode of use. the adapter device is first installed on the plate of the interface device and then receives the carrier pod.

According to a second mode of use, the carrier pod is first installed on the adapter device, the assembly then being positioned on the plate and behaving as a collective carrier pod with respect to the interface device.

According to one feature of the invention, the carrier pod is fitted on a support plate of the adapter device, which comprises positioning means for centering of the pod, securing means to keep the carrier pod stable on the support plate, and means for reading and transmitting information relating to the individual or collective carrier pods.

The adapter device is advantageously placed on a housing device, which can be permanently fixed to the interface device or be mobile so as to be able to adapt to several interface devices.

According to another feature of the invention, the housing device is equipped with a sliding rack movable from a storage position to a protruding position to enable automatic loading of the adapter device on the plate of the interface device. The sliding rack is provided with a raising mechanism to raise the adapter device from the protruding position to a raised position corresponding appreciably to the level of the movable plate of the interface device.

According to another feature of the invention, the side wall of the adapter device is rendered mobile to enable loading via the top of the carrier pod, and moreover operates in conjunction with a guiding device associated to a return spring to perform locking and unlocking of the securing means.

To eliminate problems of contamination induced by the side wall of the interface device when the two doors are withdrawn, the external face of the side wall is covered by a protective plate, which is automatically removed from said face and transferred onto the second door when mechanical linking of the two doors takes place, following the backward movement of the guiding device in the locking direction after the side wall has accosted with the front face of the interface device. The contamination is thus trapped between the wafer and the second door.

According to an alternative embodiment, the external face of the side wall bears an interchangeable multisheet adhesive block, removal of a contaminated sheet being performed each time the adapter device is used to free a new sheet exempt from particle contamination.

BRIEF DESCRIPTION OF THE DRAWINGS

Other advantages and features will become more clearly apparent from the description which follows of different embodiments, given as non-restrictive examples only and represented in the accompanying drawings, in which:

FIGS. 8A and 88 are identical views to FIGS. 6A and 6B of another alternative embodiment of the adapter device;

DETAILED DESCRIPTION OF PREFERRED EMBODIMENT

Figure 2:
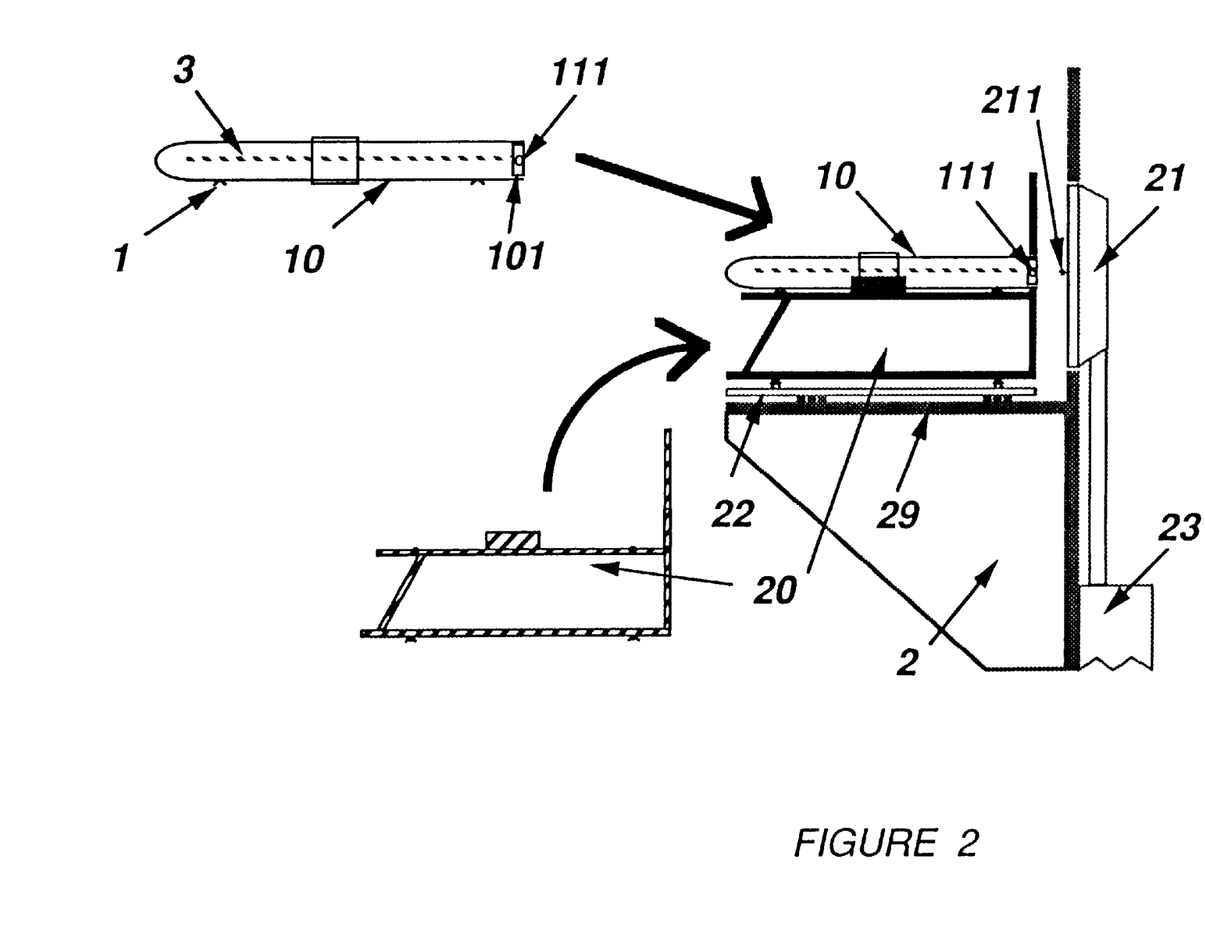
FIG. 2 represents use of an adapter device according to the invention with an individual carrier pod.

With reference to FIG. 2, the adapter device designated by the general reference 20 is used to position an individual container 10, hereinafter called carrier pod, heightwise on an interface device 2 interfacing with production equipment (not represented). The individual carrier pod 10 comprises a body 1 of elongate shape made of plastic or metallic material, containing a flat object 3, for example a silicon wafer with a diameter of 300 mm. The side face of the individual carrier pod 10 is provided with an orifice which can be sealed by means of a first door 101 equipped with a first lock 111 arranged to perform opening and closing of the door 101. The structure of a carrier pod of this kind is described in French Patent applications No. 9212423 and 9604173.

Figure 1:
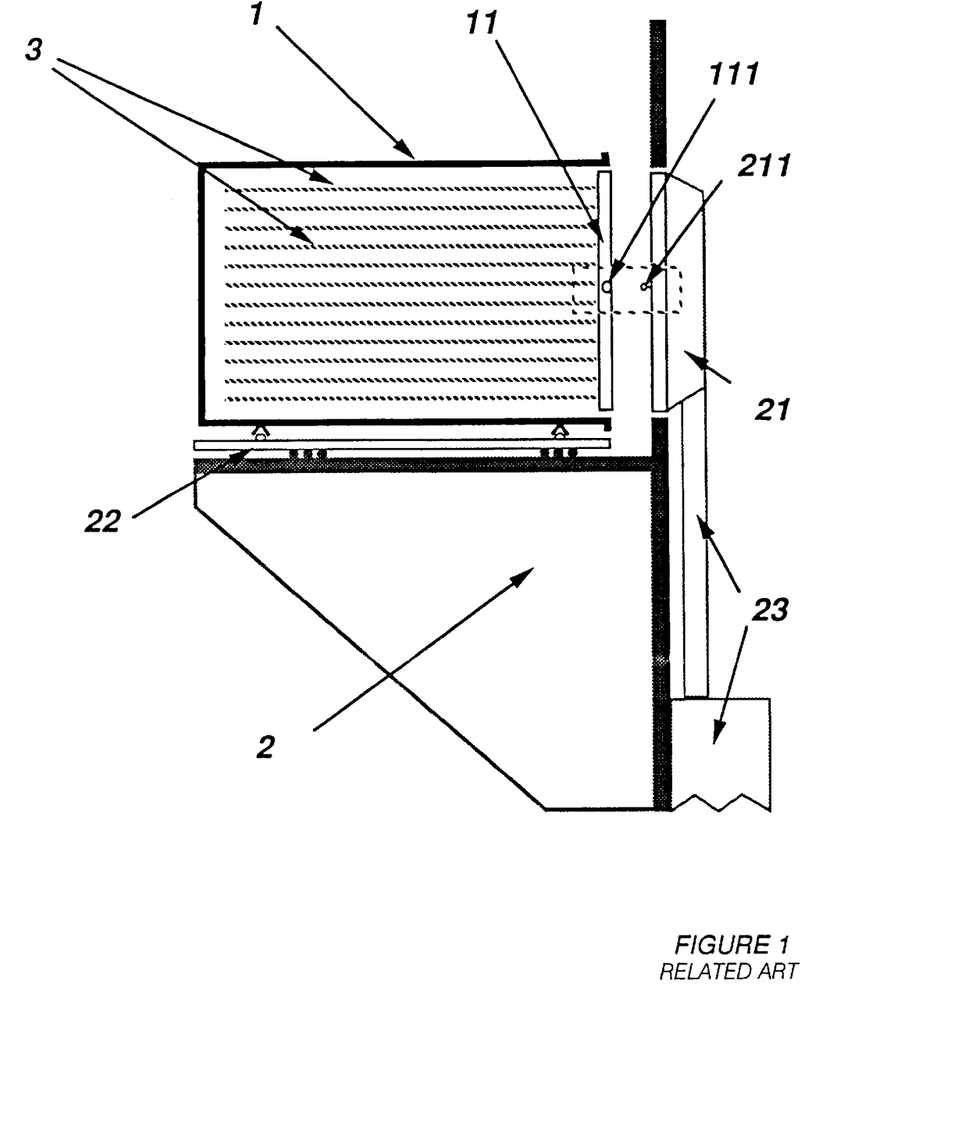
FIG. 1 is a schematic sectional view of a device of the prior art for transfer of the wafers from a collective carrier pod to the production equipment.

The interface device 2, of the type described in the document EP 0735573, comprises an operating mechanism 23 coupled to a second door 21 which is provided with a second lock 211 designed to operate in conjunction with the first lock 111 when transfer of the flat object 3 takes place. A movable support plate 22 is placed on the horizontal base 29 of the interface device 2 and acts as support for the adapter device 20. There are two possible modes of use:

the individual carrier pod 10 is disposed on the adapter device 20 after the latter has been installed on the support plate 22 (case of FIG. 2);

the individual carrier pod 10 is first installed on the adapter device 20 and the assembly is then positioned on the support plate 22, as in the case of a collective carrier pod 1 of FIG. 1.

Figure 3:
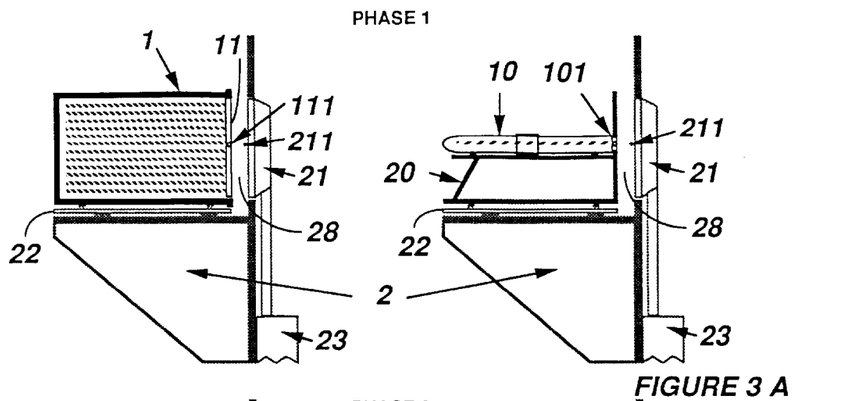
FIGS. 3A, 3B and 3C successively represent the loading, accosting and opening phases when compared operation of the collective carrier pod system according to the prior art (on the left) and of the individual carrier pod system according to the invention (on the right) take place.

FIGS. 3A–3C show the comparative transfer process between collective carrier pods 1 (on the left) and individual carrier pods 10 (on the right). Due to the presence of the adapter device 20, the same equipment interface device 2 for collective carrier pods 1 can be used to open or close individual carrier pods 10. The operating mechanism 23 thus enables the first door 101 of the individual carrier pod 10 to be removed instead of the door 11 of the collective carrier pod 1.

The sequence of operations involved in the opening process of the two configurations is as follows:

In FIG. 3A corresponding to the loading phase, the collective carrier pod 1 and the individual carrier pod 10 are installed and locked on the movable support plate 22 of the interface device 2. A gap 28 of small thickness separates the two locks 111, 211 and the two respective doors 11, 101; 21.

In FIG. 3B corresponding to the accosting phase, the movable support plate 22 is moved in translation to bring the collective carrier pod 1 and the individual carrier pod 10 into contact with the second door 21 of the interface device 2. The two locks 111, 211 operate in conjunction with one another to couple the first door 11 or 101 mechanically with the second door 21 and to unlock the first door 11, 101 of the respective carrier pod 1, 10. The second door 21 remains immobile during this accosting phase.

In FIG. 3C corresponding to the opening phase of the carrier pods 1, 10, the operating mechanism 23 is animated with a combined horizontal and vertical translation movement to simultaneously move the two doors 11, 101; 21 to a withdrawn position situated in the lower internal part of the interface device 2. The input orifice 5 of the carrier pod 1, 10 is then freed enabling a robot 4 to operate to exchange the wafer(s) 3 with the equipment.

Figure 4:
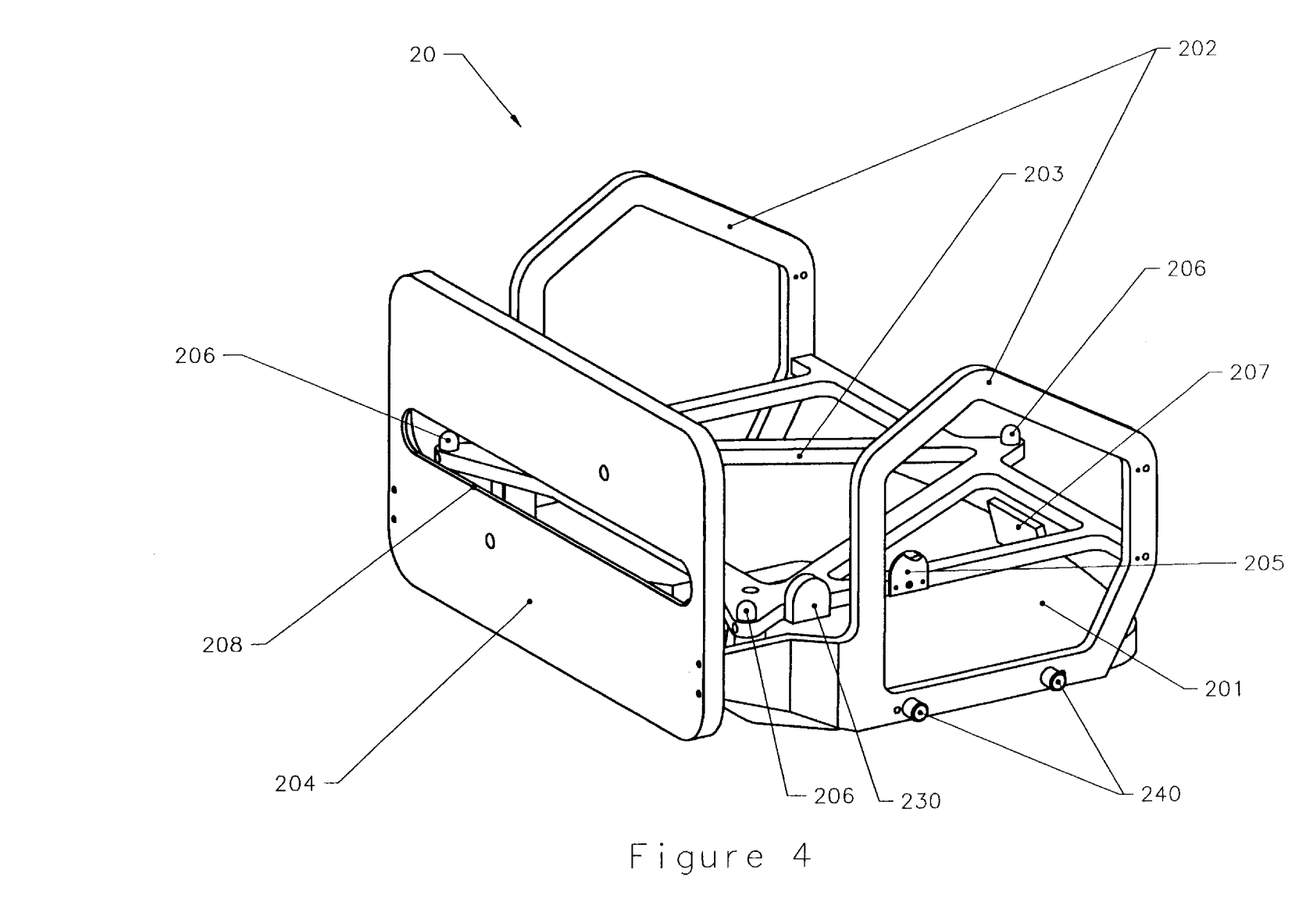
FIG. 4 shows a perspective view of the adapter device.
Figure 5:
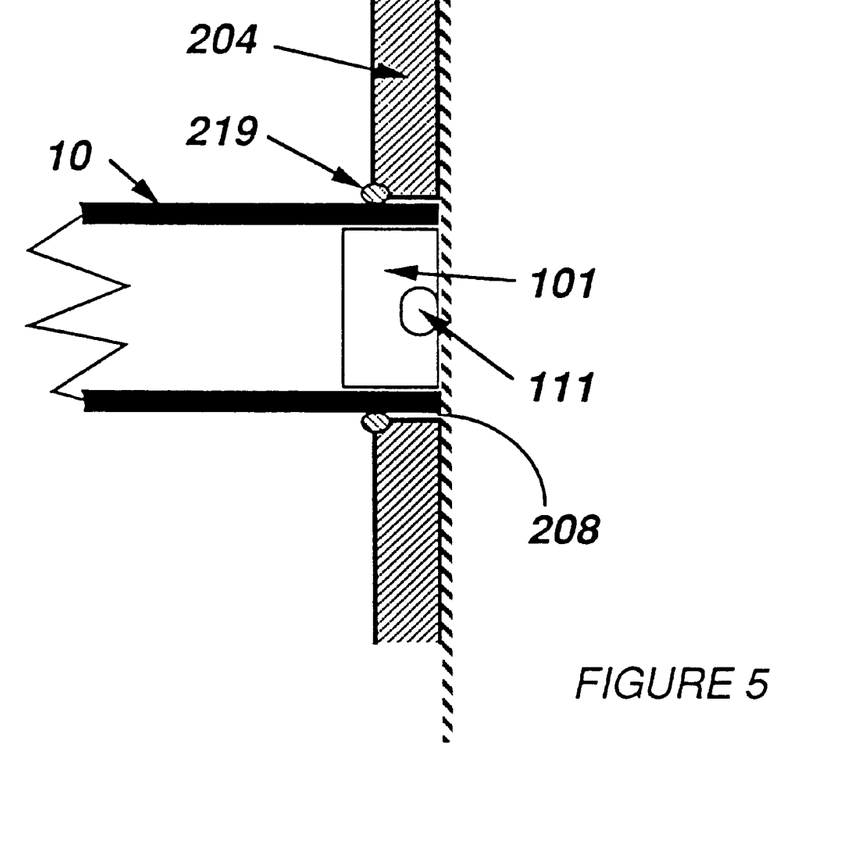
FIG. 5 shows the positioning of the first door in alignment with the front bearing plane of the external side wall of the adapter device.

With reference to FIG. 4 representing the basic version of the adapter device 20, the bottom part of the base 201 is equipped with mechanical guide means designed to ensure standard operation of the adapter device 20 on the movable support plate 22 of the interface device 2. A side wall 204 comprising an aperture 208 allowing passage of the individual carrier pod 10 is secured to the base 201, so as to position the first door 101 and its lock 111 in alignment with the front support plane of the external side wall 204 of the adapter device 20, as shown in FIG. 5. Such an arrangement is perfectly suited to mechanical linking of the first door 101 of the individual carrier pod 10 with the second door 21 of the interface device 2 due to the operation of the respective locks 111, 211. A seal 219 fitted on the periphery of the aperture 218 ensures that the carrier pod and equipment are tightly sealed with respect to the outside of the system.

The vertical offset of the aperture 208 with respect to the bottom edge of the side wall 204 corresponds to the heightwise positioning of the individual carrier pod 10. The adapter device 20 comprises for this purpose a support plate 203 perfectly positioned heightwise with respect to the base 201 and designed to receive the individual carrier pod 10. The horizontal support plate 203 extends perpendicularly to the side wall 204 and comprises positioning means 206 for centering the carrier pod 10, as well as securing means 205 to keep the carrier pod 10 stable on the adapter device 20. The arrangement of the positioning means 206 and securing means 205 on the support plate 203 is compatible with available individual carrier pods.

The base 201 is provided with two joining arms 202 on which the side wall 204 and support plate 203 are fixed to form a rigid assembly. The two joining arms 202 also act as handles for handling the adapter device 20.

An electronic label reader 230 is fixed to the support plate 203 and operates in conjunction with an electronic batch tracking device designed to transmit information by infrared or radiofrequency channels to a fab control system. The base of each joining arm 202 is provided with protruding studs 240 necessary for handling the adapter device 20.

In the basic version of FIG. 4, the individual carrier pod 10 is loaded onto the support plate 203 manually, and locking thereof by the securing means 205 is also performed by a manual action.

Figure 6:
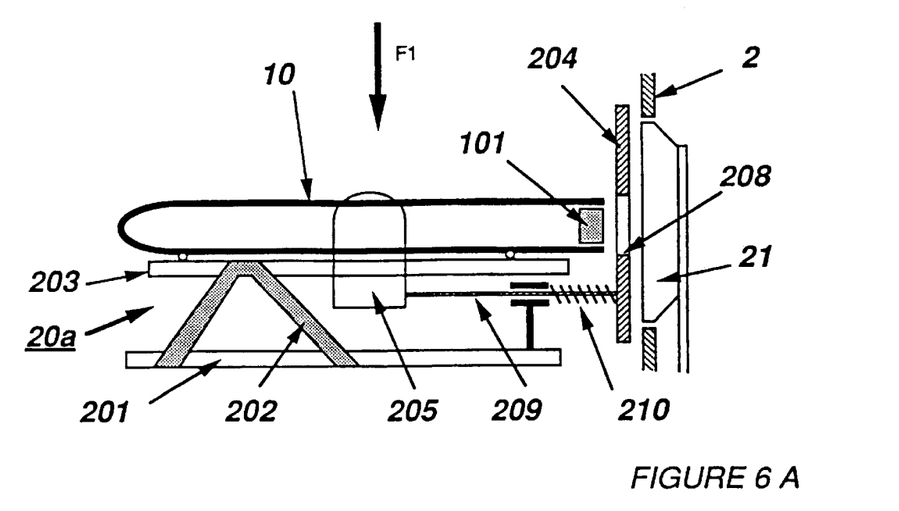
FIGS. 6A and 6B show similar views of an alternative embodiment of the adapter device of FIG. 2, respectively in the loading position, and in the locking position of the carrier pod after accosting.

In FIGS. 6A and 6B, an alternative embodiment of the adapter device 20a is designed to allow vertical loading of the individual carrier pod 10 following operation of the robotized transport device (not represented) in the direction of the arrow F1. The side wall 204 is no longer secured in fixed manner to the base 201, but is rendered mobile to enable automatic loading via the top.

When the loading phase of the individual carrier pod 10 takes place (FIG. 6A), the side wall 204 is urged in translation to a withdrawn inactive position by the action of a guiding device 209 associated to a return spring 210. The side wall 204 is moved away from the door 101 to free the loading space completely. The securing means 205 are in this case formed by an automatic locking unlocking mechanism of the individual carrier pod 10 on the support plate 203. The guiding device 209 comprises an actuating spindle operating in conjunction with an actuating mechanism of the securing means 205 to derive a pivoting movement of the attachment system of the carrier pod 10 from the translation movement of the spindle.

In FIG. 6B, the translation movement of the adapter device 20a in the direction of the arrow F2, when accosting of the side wall 204 with the front face of the interface device 2 take places, allows a continuing movement of the carrier pod 10 to the active linked position of the doors 101, 21, described with reference to FIG. 5. The movement of the actuating spindle of the guiding device 209 in the direction of the arrow F3 during this travel causes compression of the spring 210 and locking of the carrier pod 10 on the adapter device 20a.

Figure 7:
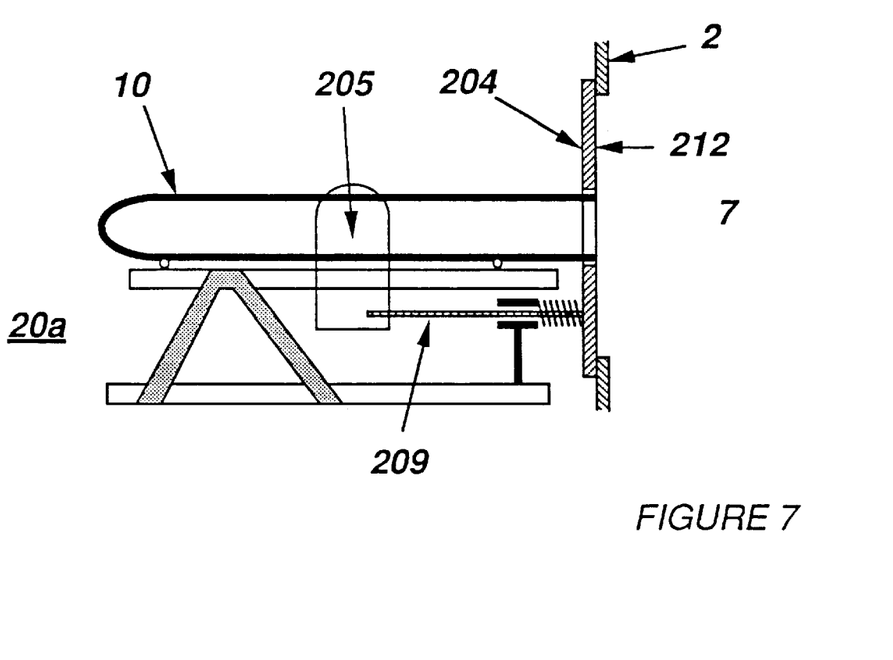
FIG. 7 is an identical view to FIG. 6B after the two doors have been removed.

FIG. 7 shows the device of FIG. 68 after the two doors 101, 21 have been removed. The external face 212 of the side wall 204, which is continuously in relation with an environment less stringently controlled as far as particles are concerned, is liable to be contaminated by particles. This contaminated face is located facing the ultraclean space 7 of the equipment, which gives rise to problems of contamination induced in the interface device 2 by the external face of the wall 204.

Figure 8:
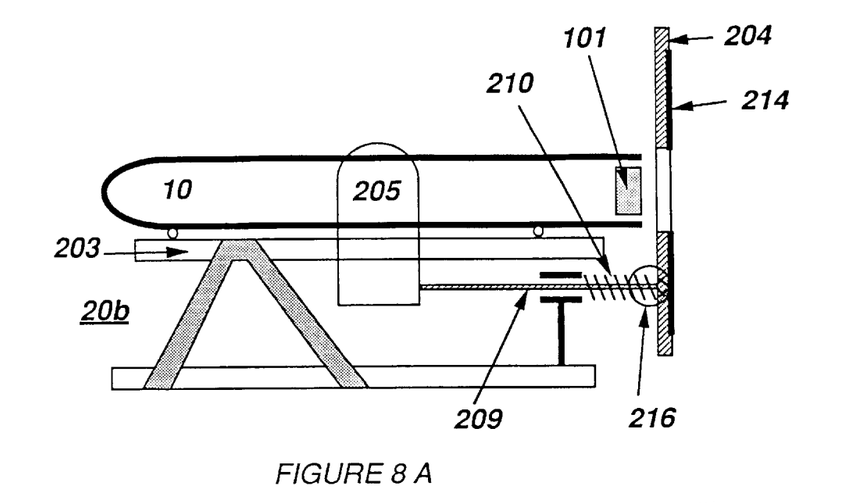

FIGS. 8A and 8B show another alternative version of the adapter device 20b which enables this contamination problem to be overcome. The external face 212 of the side wall 204 is covered by a protective plate 214, which is automatically removed from the face 212 and transferred onto the second door 21 when mechanical linking of the two doors 101, 21 takes place. The protective plate 214 is normally fixed onto the wall by means of a fixing part 216 having a first part 216a secured to the actuating spindle of the guiding device 209, and a complementary second part 216b securedly affixed to the protective plate 214. The second part 216b is released from the first part 216a as soon as the backward movement of the guiding device 209 occurs when accosting of the side wall 204 with the front face of the interface device 2 takes place. The second door 21 is advantageously equipped with a securing device 218 of the protective plate 214. in particular by suction.

Figure 8C:
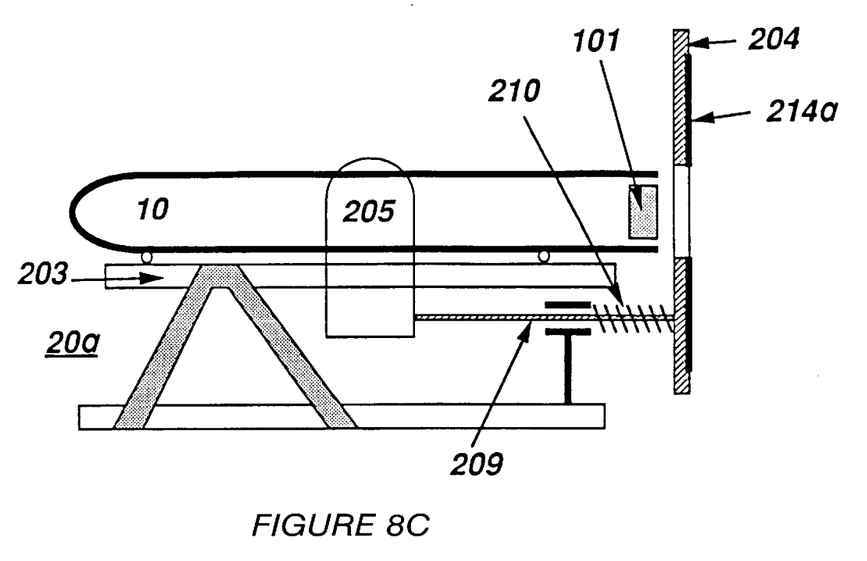
FIG. 8C represents an alternative embodiment of the adapter device.

According to an alternative embodiment shown in FIG. 8C, the protective plate 214 can be replaced by an adhesive block 214a with multiple sheets, of the same shape as the protective plate 214. Each time the adapter device 20a is used, the operator removes the contaminated layer to free a new layer exempt from particle contamination. The securing device 218 is not necessary in this case. Different materials can be used to achieve the multisheet adhesive block 214a:
  either special clean room paper covered with a layer of conventional adhesive,
  or a multitude of very fine polycarbonate sheets held together by electrostatic effect.

Figure 9:
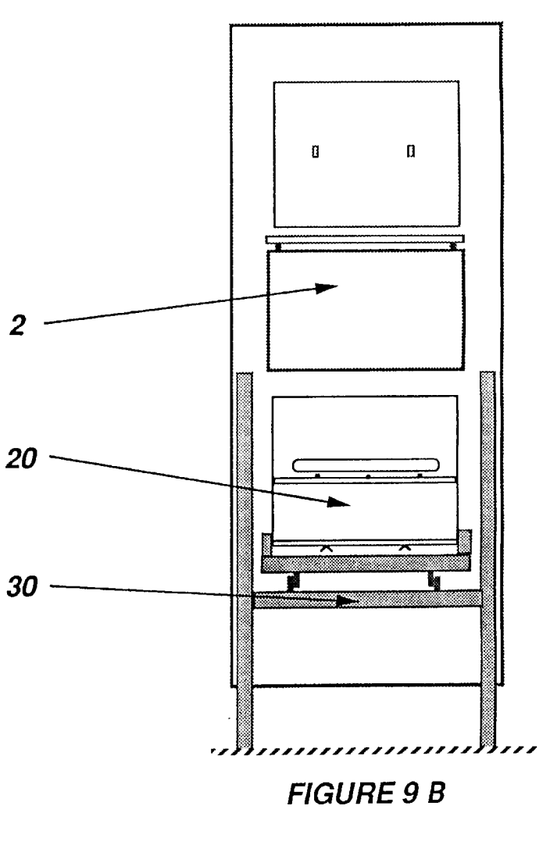
FIGS. 9A and 9B respectively represent sectional and elevational views of the adapter device stored on a housing device.

FIGS. 9A and 9B show the adapter device 20 used as an accessory of the interface device 2. The adapter device 20 is advantageously placed on the upper face of a housing device 30 fixed to the bottom part of the interface device 2 and comprising a horizontal shelf 302 equipped with a sliding rack 301 placed on the shelf 302 and supported by interposed sliding or rolling parts 303. The sliding rack 301 is in the storage position being housed under the protruding part of the interface device 2. A guiding system 305 enables the adapter device 20 to be positioned with respect to the sliding rack 301.

Figure 10:
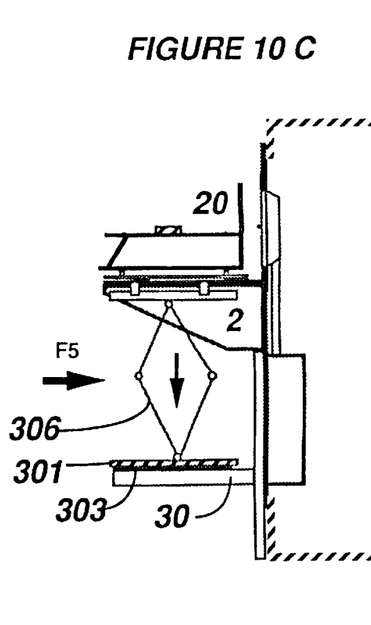
FIGS. 10A to 10C show the different handling phases of the adapter device from its housing device up to its placement on the plate of the interface device.

FIGS. 10A–10C represent the withdrawal phases of the sliding rack 301 for transfer of the adapter device 20 to the movable support plate 22 of the horizontal base 29 of the interface device 2. In FIG. 10A, the adapter device 20 is moved in translation according to the arrow F6 to a protruding position to escape from the bottom of the base 29. The rack 301 is provided with a raising mechanism 306 actuated by the operator to lift the adapter device 20 in the direction of the arrow F4 to a raised position (FIG. 10B). The movement of the sliding rack 303 in the direction of the arrow F5 to the non-protruding position then enables the adapter device 20 to be deposited on the movable support plate 22 of the interface device 2 (FIG. 10C). The raising mechanism 306 is formed for example by a pantograph system, which remains in the extended position when the last translation movement takes place in the direction of the arrow F5. A counterweight device (not represented) can be associated to the raising mechanism 306 to assist the operator in performing this handling operation.

In the position of FIG. 10C, the raising mechanism 306 can be actuated to the lowered position so as to release the adapter device 20. The adapter device 20 will move on its own when the accosting phase takes place during the transfer cycle.

The raising mechanism 306 can also remain permanently joined to the adapter device 20. The sliding rack 303 in this case follows the movement of the adapter device 20 to the accosting position when the transfer cycle takes place.

It is clear that the loading and unloading mechanism of the adapter device 20 can be fully automated.

Figure 11:
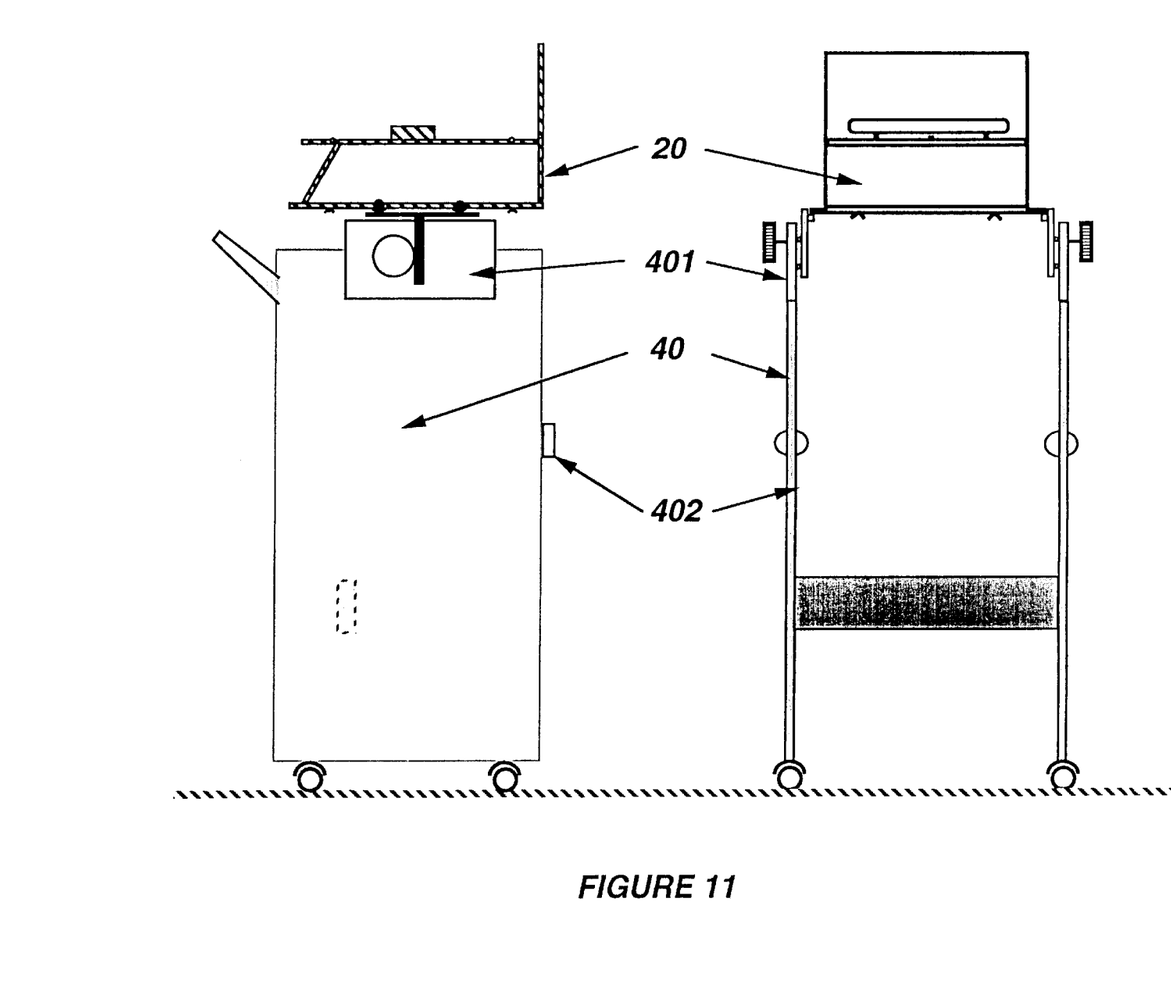
FIG. 11 represents a mobile housing element associated to the adapter device according to the invention to reconfigure a standard opening system.

In FIG. 11, the housing device can advantageously take the form of a mobile housing element 40 enabling the adapter device 20 to be fitted on any type of interface device.

Figure 12:
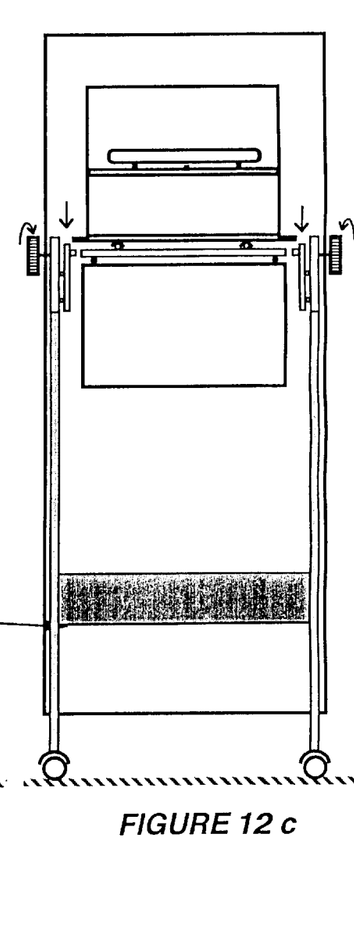
FIGS. 12a, 12b and 12c show the different phases of placing of the adapter device according to the invention from a mobile housing element.

In FIGS. 12a–12c, a raising and lowering mechanism 401 on the one hand enables the adapter 20 to be kept in a raised position to avoid the positioning elements of the interface system in the loading position (FIGS. 12a and 12b), and on the other hand performs placing and releasing of the adapter 20 on the guides of the interface system support plate. The mobile housing element 40 is placed with respect to the interface system by means of positioning means 402 so as to allow reconfiguration of the interface system enabling the latter to receive individual carrier pods.

Figure 13:
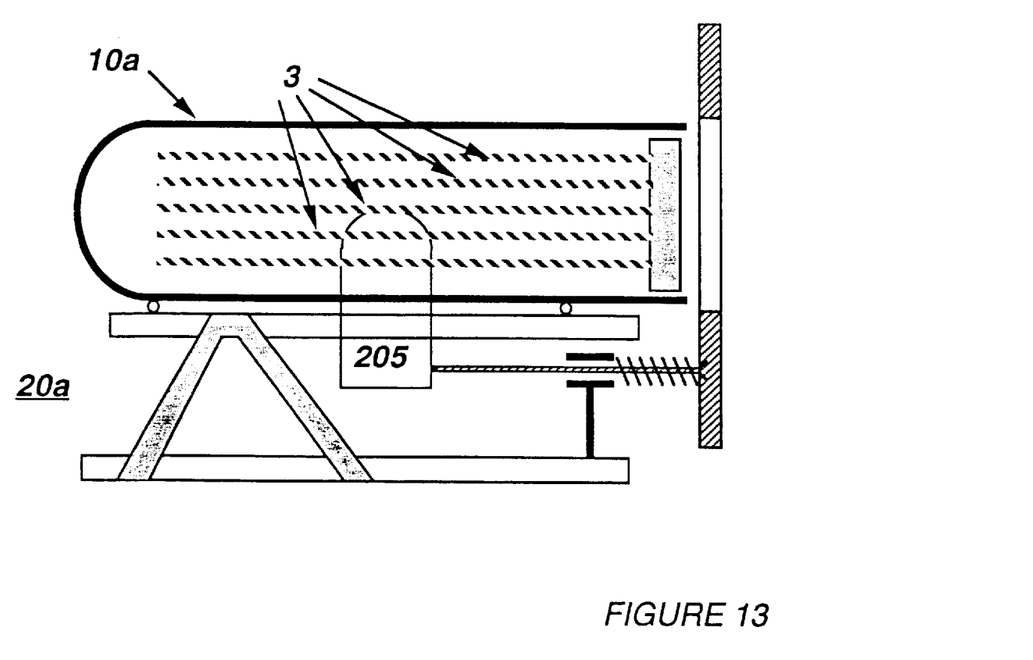
FIG. 13 shows the application of the adapter device according to the invention for a carrier pod containing five wafers.

The invention also applies to interface handling of a carrier pod 10a containing several silicon plates 3, for example about five (see FIG. 13).

What is claimed is:

1. An adapter device for allowing the transfer of a wafer located within an individual carrier pod container to a standard interface production equipment for collective carrier pods and enabling the same standard interface production equipment for collective carrier pods to open or close the individual carrier pod container, wherein each individual carrier pod container is sealed by a sealing means comprising a first door and a first lock, and is placed facing a second door and a second lock of the standard interface production equipment, whereby the first and second doors are locked together and moved causing opening of an input orifice of the individual carrier pod container for allowing the transfer of the wafer with the standard interface production equipment, the standard interface production equipment having a front face and a base, and a housing fixed to the standard interface production equipment, the housing having a sliding rack and the housing able to be mobile, the adapter device comprising:
  a horizontal support plate having positioning means for a heightwise positioning of the individual carrier pod container with respect to the base, so as to center the individual carrier pod container in front of the standard interface production equipment; and a vertical side wall including an aperture allowing each individual carrier pod container to pass through, the side wall extending perpendicularly to the support plate, so as to close the internal space of the standard interface production equipment upon positioning the vertical side wall against the front face of the standard interface production equipment.

2. The adapter device according to claim 1, wherein the adapter device is first placed upon the base and then receives the individual carrier pod container.

3. The adapter device according to claim 1, wherein the individual carrier pod container is first placed upon the adapter device, the adapter device and individual carrier pod container therein then being positioned on the base as if a collective carrier pod with respect to the standard interface production equipment.

4. The adapter device according to claim 1, wherein the individual carrier pod container is mounted on the support plate of the adapter device, the adapter device further comprising positioning means for centering of the individual carrier pod container, securing means to keep the individual carrier pod container stable on the support plate, and means for reading and transmitting information relative to the individual carrier pod container.

5. The adapter device according to claim 4, wherein the side wall of the adapter device is movable from a loading space of the adapter device to enable loading via a top of the individual carrier pod container and operates in conjunction with a guiding device and a return spring to perform locking and unlocking of the securing means.

6. The adapter device according to claim 5, wherein an external face of the side wall is covered by a protective plate for protection against contaminants, which protective plate is automatically removed from the external face and transferred onto the second door when mechanical linking of the first and second doors takes place, following a backward movement of the guiding device in a locking direction after the side wall has been positioned in alignment with the second door of the standard interface production equipment, the contaminants thus being trapped between the protective plate and the second door.

7. The adapter device according to claim 5, wherein an external face of the side wall bears an interchangeable multisheet adhesive block, whereby a sheet of the multisheet adhesive block contacts the front face of the standard interface production equipment and is removed to expose another sheet of the multisheet adhesive block that is exempt from contaminants each time the adapter device is used and the front, face of the standard interface production equipment contacts a sheet of the multisheet adhesive block and withdraws from the adapter device.

8. The adapter device according to claim 1, wherein the adapter device is placed on the housing fixed to the standard interface production equipment.

9. The adapter device according to claim 8, wherein the housing is equipped with the sliding rack movable from a storage position to a protruding position and the adapter device on the base is positionable relative to the standard interface production equipment.

10. The adapter device according to claim 9, wherein a raising mechanism raises the adapter device from the protruding position to a raised position corresponding to a level of the standard interface production equipment and the sliding rack moves the adapter device to the front face of the standard interface production equipment.

11. The adapter device according to claim 1, wherein the adapter device is used with the mobile housing equipped with positioning means for positioning the adapter device with respect to the standard interface production equipment, and with a raising and lowering mechanism enabling the adapter device to be engaged with and removed from the standard interface production equipment.

12. An individual carrier pod transport system comprising standard interface production equipment and the adapter device of claim 1.

* * * * *